United States Patent
Casagrande (10) Patent No.: US 6,570,443 B2
(45) Date of Patent: May 27, 2003

(54) AMPLITUDE CONTROL OF AN ALTERNATING SIGNAL GENERATED BY AN ELECTRONIC DEVICE SUCH AS AN OSCILLATOR CIRCUIT

(75) Inventor: Arnaud Casagrande, Lignières (CH)

(73) Assignee: Asulab S.A., Marin (CH)

( * ) Notice: Subject to any disclaimer, the term of this patent is extended or adjusted under 35 U.S.C. 154(b) by 0 days.

(21) Appl. No.: 09/971,078

(22) Filed: Oct. 5, 2001

(65) Prior Publication Data
US 2002/0067204 A1 Jun. 6, 2002

(30) Foreign Application Priority Data
Oct. 17, 2000 (CH) ............................... 2035/00

(51) Int. Cl.[7] ............................... H03G 3/20
(52) U.S. Cl. ............................... 330/129; 330/137
(58) Field of Search ............................... 330/129, 130, 330/134, 137

(56) References Cited

U.S. PATENT DOCUMENTS

| | | |
|---|---|---|
| 3,828,270 A | 8/1974 | Ebisch |
| 4,083,237 A | 4/1978 | Levesque |
| 4,194,164 A | 3/1980 | Owen ........................ 330/129 |
| 5,208,549 A * | 5/1993 | Andoh ........................ 330/129 |
| 5,208,550 A * | 5/1993 | Iwane ........................ 330/129 |
| 5,642,075 A * | 6/1997 | Bell ........................ 330/129 |
| 5,805,986 A * | 9/1998 | Mizusawa et al. ........... 455/115 |

* cited by examiner

Primary Examiner—Robert Pascal
Assistant Examiner—Khanh Van Nguyen
(74) Attorney, Agent, or Firm—Sughrue Mion, PLLC (57) ABSTRACT

There is described an amplitude-controlled electronic device (1) intended to generate at an output (11; 11a) an alternating output signal (S1; Sosc) of substantially constant amplitude. This electronic device includes a measuring branch (20; 20*; 201) for generating a measuring voltage (Vout) representative of the amplitude of the output signal (S1; Sosc) and means for generating a reference voltage (Vref) including a reference branch (40; 40*; 400) matched with the measuring branch and at the input (A) of which a voltage reference (U0) is selectively switched. A comparator (30; 300) is arranged for comparing the measuring and reference voltages and generating in response a control signal (Sc) which is applied on a control terminal (12) of the electronic device. According to the invention, the matching of the measuring and reference branches allows the sensitivity of the control signal to temperature and manufacturing process variations to be substantially cancelled.

18 Claims, 4 Drawing Sheets

AMPLITUDE CONTROL OF AN ALTERNATING SIGNAL GENERATED BY AN ELECTRONIC DEVICE SUCH AS AN OSCILLATOR CIRCUIT

BACKGROUND OF THE INVENTION

The present invention relates to an amplitude-controlled electronic device, such as an oscillator device, intended to generate an alternating output signal of substantially constant amplitude in accordance with the preamble of claim 1.

A solution for controlling of the amplitude of an alternating output signal generated by an electronic device, such as an oscillator circuit, typically consists in providing the electronic device with an amplitude control loop. This amplitude control loop typically includes a measuring branch intended to generate a measuring voltage representative of the amplitude of the output signal, such measuring voltage being compared to a reference value in order to generate a control signal, or slaving signal, which is applied to the electronic device for the purpose of slaving the output signal to a determined value.

SUMMARY OF THE INVENTION

A drawback of this solution lies in the fact that the measuring branch allowing the measuring voltage representative of the output signal amplitude to be generated is commonly sensitive to temperature variations and is sensitive to variations in the manufacturing process. This sensitivity has direct repercussions on the control signal so that a constant output signal amplitude cannot be guaranteed with such a solution.

A main object of the present invention is thus to propose an electronic device wherein the amplitude control of the output signal is in particular substantially independent of variations in temperature and manufacturing processes.

Document U.S. Pat. No. 3,828,270 already describes an amplitude-controlled electronic device fulfilling the above-mentioned main object. This document describes a device for generating an alternating output signal and comprising a measuring branch for generating a measuring voltage representative of the amplitude of the alternating output signal, a reference branch for generating a reference voltage and comparator means for comparing the measuring and reference voltages and for generating a control signal of the amplitude of the output signal. The measuring and reference branches are matched so as to exhibit similar sensitivity to temperature and manufacturing process variations. The device however requires an additional source for generating the reference voltage as well as attenuators pour setting the value of this reference voltage, the characteristics of these attenuators being adjusted by hand.

Another object of the present invention is thus to propose a solution which is more simple in design that prior art solutions and which is in particular suited for low consumption applications.

The present invention therefore concerns an amplitude-controlled electronic device whose features are listed in independent claim 1.

Advantageous embodiments form the subject of the dependent claims.

According to the invention, the reference voltage is thus generated at the output of a reference branch matched with the measuring branch which generates the measuring voltage representative of the amplitude of the electronic device output signal, such reference voltage being in particular obtained by switching a voltage reference at the input of the measuring branch. The result of matching the measuring and reference branches is that the sensitivity to temperature and manufacturing process variations of these voltages are substantially equal so that the control signal generated in response to the comparison of such voltages is substantially independent of these variations.

The switching frequency of the voltage reference may in particular be selected to be lower that the frequency of the alternating signal generated at the output of the electronic device, thereby lowering the consumption of the control system.

Preferably, the switching frequency of the voltage reference is derived from the frequency of the alternating output signal generated by the electronic device. Accordingly, it is not necessary to use an additional source for generating the reference voltage.

BRIEF DESCRIPTION OF THE DRAWINGS

Other features and advantages of the present invention will appear more clearly upon reading the following detailed description, made with reference to the annexed drawings, given by way of non-limiting example and in which.

DETAILED DESCRIPTION OF THE INVENTION

Figure 1:
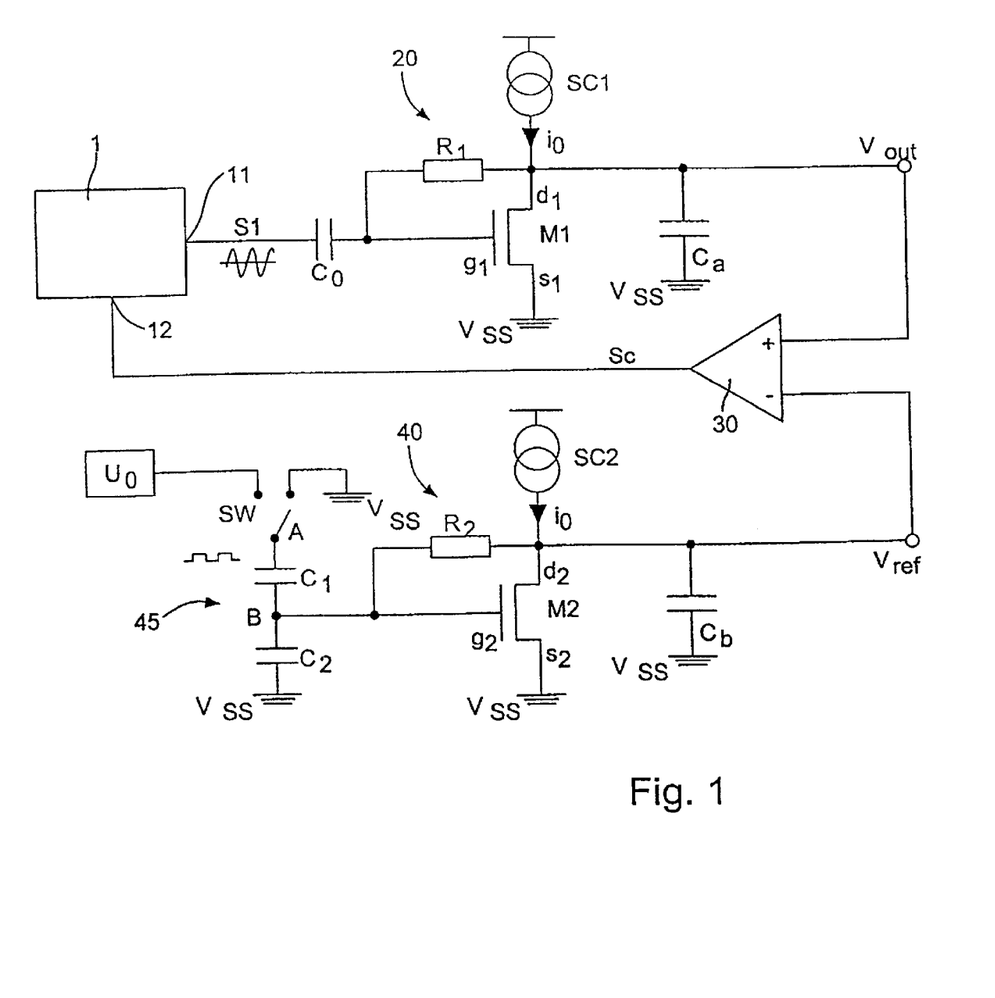
FIG. 1 shows a functional diagram of a first embodiment of the present invention employing matched MOS transistors operating in weak inversion mode.

FIG. 1 shows a functional diagram a first embodiment of the present invention employing matched MOS transistors operating in weak inversion mode. As illustrated in FIG. 1, an electronic device, indicated by the reference numeral 1, supplies at an output 11, an alternating output signal S1, the amplitude of which one wishes to control. Electronic device 1 may for example be an oscillator circuit, but may be formed of any other electronic device generating an alternating output signal whose amplitude one wishes to control, such as a power amplifier.

Output signal S1 is applied on a first branch, or measuring branch, designated by reference numeral 20, which supplies at its output a measuring voltage Vout representative of the amplitude of signal S1 to be controlled. This measuring signal Vout is compared to a reference value Vref by means of a comparator 30. This comparator 30 supplies in response a control signal Sc which is applied on a control terminal 12 of electronic device 1.

As mentioned in the preamble, measuring branch 20 which generates measuring voltage Vout representative of the amplitude of the output signal S1 is sensitive to temperature and manufacturing process variations. In order to compensate for and substantially cancel this sensitivity of measuring branch 20, according to the invention, a reference voltage Vref is generated with a sensitivity to temperature and manufacturing process variations which is substantially equal to the sensitivity of measuring voltage Vout.

For this purpose, according to the present invention, a second branch, or reference branch which is matched with the measuring branch is used in order to generate reference voltage Vref. As illustrated schematically in FIG. 1, reference voltage Vref is generated by switching a substantially temperature stable voltage reference U0 at the input of a reference branch 40 matched with measuring branch 20. Voltage reference U0 may commonly be a bandgap reference or any other voltage reference having good temperature stability.

Preferably, the switching frequency of voltage reference U0 is derived from the frequency of the alternating output signal generated by the electronic device, for instance by means of a division chain.

According to the first embodiment of the invention illustrated in FIG. 1, the first and second matched branches 20 and 40 use MOS transistors polarised so as to operate in weak inversion mode. Measuring branch 20 thus includes a first capacitive element C0, a first MOS transistor M1, a first current source SC1 supplying a determined current i0, a first resistive element R1 and a second capacitive element C1.

More specifically, the first capacitive element C0, acting as a coupling capacitor, is mounted in series between output 11 of electronic device 1 and a control electrode (gate g1) of MOS transistor M1. The latter is mounted in series with current source SC1, a current electrode (source s1) of transistor M1 being connected to a potential Vss, forming a ground potential in this example, and the other current electrode (drain d1) is connected to current source SC1. Resistive element R1 is arranged between control electrode g1 and current electrode d1 of transistor M1 in order to assure adequate biasing of the latter. The second capacitive element Ca, acting as a decoupling capacitor, is arranged in parallel with transistor M1 between its current electrode d1 and ground Vss. Measuring voltage Vout representative of the amplitude of output signal S1 is generated at current electrode d1 of transistor M1.

The second branch 40, matched with measuring branch 20, includes a capacitive divider 45 including third and fourth capacitive elements C1, C2 mounted in series between a terminal A and ground potential Vss, a second MOS transistor M2, a second current source SC2 also supplying a current i0, a second resistive element R2 and a fifth capacitive element Cb. More particularly, an intermediate terminal B of capacitive divider 45, namely the connection node between capacitive elements C1 and C2, is connected to a control electrode (gate g2) of the second transistor M2. The latter is mounted in series with the second current source SC2. A current electrode (source s2) of transistor M2 is connected to potential Vss, and the other current electrode (drain d2) is connected to current source SC2. Resistive element R2 is also arranged between control electrode g2 and current electrode d2 of transistor M2 in order to assure adequate biasing of the latter. The fifth capacitive element Cb, acting as a decoupling capacitor, is arranged in parallel with transistor M2 between its current electrode d2 and ground Vss. Reference voltage Vref is generated at current electrode d2 of transistor M2.

Since branches 20 and 40 are matched, it will be clear that the values and/or features of the constituent elements of these branches are substantially equal. Thus resistive elements R1, R2, current sources SC1, SC2, and MOS transistors M1 and M2 are respectively matched. Current sources SC1, SC2 are for example generated by a "current mirror" circuit arrangement (not illustrated in the Figure) known to those skilled in the art.

According to the invention, reference voltage Vref is generated by switching a voltage reference U0 at the input of second branch 40, indicated by terminal A of capacitive divider 45 in FIG. 1. For this purpose, a switch SW is arranged between voltage reference U0 and terminal A of capacitive divider 45. This switch SW selectively applies voltage reference U0 and ground potential Vss on terminal A of capacitive divider 45. This switch SW may be operated at a lower frequency than the frequency of alternating signal S1 generated by electronic device 1. Consequently, the current consumption of the control system according to the present invention may be low, making the latter perfectly able to be used for low power applications, in particular for the purpose of incorporation in battery-powered portable objects.

As already mentioned hereinabove, the switching frequency of switch SW is preferably derived from the frequency of the alternating output signal of electronic device 1. The switching frequency of switch SW can easily be derived from the frequency of the alternating output signal of the electronic device by means of a division chain.

It will be understood that the ratio of the values of the third and fourth capacitive elements C1, C2 forming capacitive divider 45 sets the level of reference voltage Vref. The value of these capacitive elements C1, C2 is further selected so that the sum thereof (C1+C2) is substantially equal to the value of the first capacitive element C0 mounted at the input of measuring branch 20. Such a choice has the effect of making the system independent of the gate capacity of transistors M1 and M2.

According to the invention, it will thus be understood that the respective sensitivity of measuring voltage Vout and reference voltage Vref as regards temperature and manufacturing process variations are rendered substantially equal via the use of matched branches 20, 40 to generate said voltages. As a result of this arrangement, control signal Sc generated at the output of comparator 30 is substantially independent of these variations and the amplitude of output signal S1 is consequently slaved to a value substantially independent of these variations.

Figure 2:
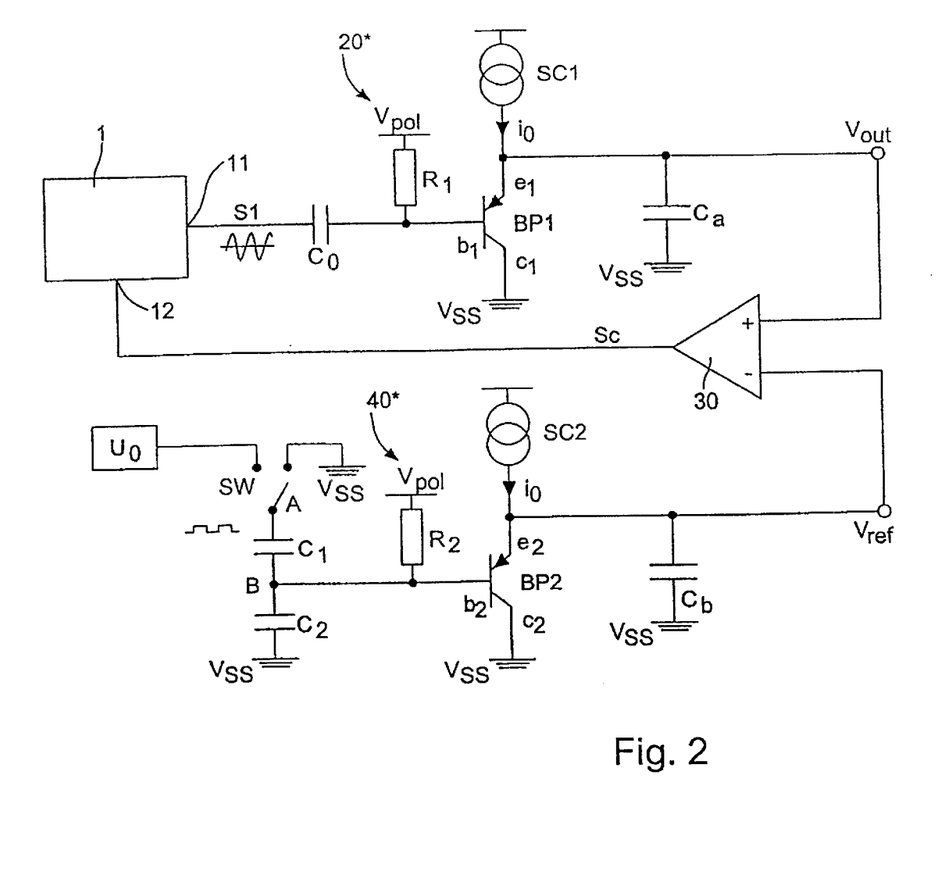
FIG. 2 shows a functional diagram of a second embodiment of the present invention employing matched bipolar transistors.

FIG. 2 shows a functional diagram of a second embodiment of the present invention using matched bipolar transistors. In a similar manner to the functional diagram of FIG. 1, electronic device 1 supplies its alternating output signal S1 to the input of a measuring branch, indicated by reference 20*, and reference voltage Vref is generated by switching a voltage reference U0 at the input of a reference branch, indicated by reference numeral 40*, matched with measuring branch 20*. A comparator 30 allows a control signal Sc to be generated in response to the comparison of measuring voltage Vout and reference voltage Vref, which is applied to a control terminal 12 of electronic device 1. In this example, however, branches 20* and 40* differ in that they each include a bipolar transistor.

According to this second embodiment of the invention illustrated in FIG. 2, measuring branch 20* thus includes a first capacitive element C0, a first bipolar pnp transistor BP1, a first current source SC1 supplying a determined current i0, a first resistive element R1 and a second capacitive element Ca. More specifically, first capacitive element C0, which acts as a coupling capacitor, is mounted in series between output 11 of electronic device 1 and a control electrode (base b1) of bipolar transistor BP1. The latter is mounted in series with current source SC1. A current collector (collector c1) of transistor BP1 is connected to ground potential Vss, and the other current electrode (emitter e1) is connected to current source SC1. Resistive element R1 is arranged between control electrode b1 of transistor BP1 and a biasing potential Vpol in order to assure adequate biasing of the transistor. The second capacitive element Ca, which acts as a decoupling capacitor, is arranged in parallel with transistor BP1 between its current electrode e1 and ground Vss. Measuring voltage Vout representative of the amplitude of output signal S1 is generated at current electrode e1 of bipolar transistor BP1.

Likewise, reference branch 40*, which is matched with measuring branch 20*, includes a capacitive divider 45 including third and fourth capacitive elements C1, C2, mounted in series between a terminal A and ground potential Vss, a second bipolar pnp transistor BP2, a second current source SC2 also supplying a current i0, a second resistive element R2 and a fifth capacitive element Cb. More particularly, an intermediate terminal B of capacitive divider 45, namely the connection node between capacitive elements C1 and C2, is connected to a control electrode (base b2) of the second bipolar transistor BP2. The latter is mounted in series with second current source SC2. A current electrode (collector c2) of transistor BP2 is connected to ground potential Vss, and the other current electrode (emitter e2) is connected to current source SC2. Resistive element R2 is also arranged between control electrode b2 of transistor BP2 and biasing potential Vpol in order to assure adequate biasing of the transistor. The fifth capacitive element Cb, which acts as a decoupling capacitor, is arranged in parallel with transistor BP2 between its current electrode e2 and ground Vss. Reference voltage Vref is generated at current electrode e2 of bipolar transistor BP2.

Like the embodiment of FIG. 1, as branches 20* and 40* are matched, it will be understood that the values and/or characteristics of the constituent elements of these branches are substantially equal. Thus, resistive elements R1, R2, current sources SC1, SC2 and bipolar transistors BP1 and BP2 are respectively matched.

According to this second embodiment, reference voltage Vref is generated, in a similar way to the first embodiment, by switching a voltage reference U0 at the input of reference branch 40*, indicated by terminal A of capacitive divider 45 in FIG. 2. A switch SW is thus arranged between voltage reference U0 and terminal A of capacitive divider 45, and applies, likewise, voltage reference U0 and ground potential Vss selectively on terminal A of capacitive divider 45.

It will further be understood that the ratio of the values of the third and fourth capacitive elements C1, C2 forming capacitive divider 45 sets the level of reference voltage Vref. The value of these capacitive elements C1, C2 is also selected so that the sum thereof (C1+C2) is substantially equal to the value of the first capacitive element C0 mounted at the input of measuring branch 20*.

This second embodiment constitutes an alternative to the first embodiment allowing a control signal Sc to be generated at the output of comparator 30 with virtually no sensitivity to temperature and manufacturing process variations. It will further be noted that the second embodiment advantageously offers the possibility of using uncharacterised vertical bipolar transistors, i.e. parasitic structures which are typically available in integrated circuits.

Figure 3:
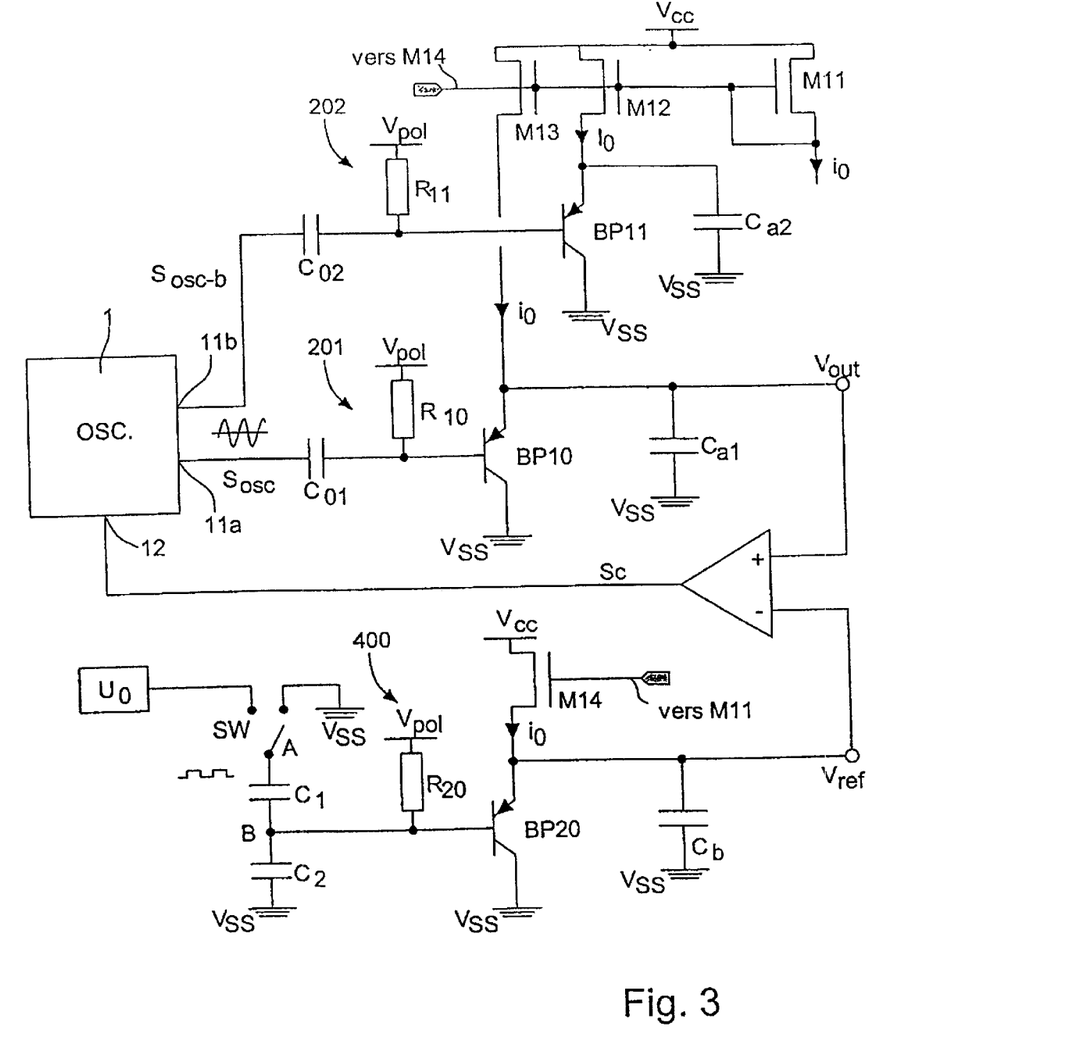
FIG. 3 shows a schematic embodiment example of the present invention based on the principle illustrated in FIG. 2 and applied to the amplitude control of an oscillator.

With reference to FIG. 3, a particular embodiment example of the present invention relying on the principle illustrated in FIG. 2, namely the principle relying on matched bipolar transistors, will now be described. As mentioned hereinbefore, these bipolar transistors may advantageously be uncharacterised vertical bipolar transistors which are typically present in the circuit.

Electronic device 1 is formed here of an oscillator circuit supplying an oscillation signal Sosc of determined frequency. By way of illustration, oscillator circuit 1 is powered by a supply voltage of the order of 1.2 V and the frequency of the oscillation signal generated by oscillator circuit 1 is of the order of 434 MHz in this example. More specifically, oscillator circuit 1, the structure of which is not detailed here since it is known to those skilled in the art, includes first and second outputs 11a and 11b respectively supplying oscillation signal Sosc and an oscillation signal Sosc.b, phase-shifted by 180° with respect to oscillation signal Sosc. Oscillator circuit 1 also includes a control terminal 12 for acting on the amplitude of output signal Sosc (respectively Sosc.b).

In order to generate measuring voltage Vout representative of the amplitude of the output signal, a measuring branch of the type illustrated in FIG. 2 is connected at the output of oscillator circuit 1. More specifically, two identical measuring branches 201 and 202 are respectively connected to output terminals 11a and 11b of oscillator circuit 1. Two measuring branches are used here in order to load the outputs of the oscillator symmetrically. However, only the output of one of the branches, here measuring branch 201, is necessary for generating the oscillator control signal (SC).

In order to generate reference voltage Vref, a reference branch 400 matched with measuring branches 201 and 202 is used in accordance with the principle described with reference to FIG. 2. Thus a voltage reference U0 is switched at an input A of second branch 400 by means of a switch SW so that voltage U0 and ground potential Vss is selectively applied at the input of second branch 400. By way of illustration, the switching frequency of switch SW is of the order of 12.5 MHz in this example. This frequency is advantageously derived from the frequency of oscillation signal Sosc by means of a division chain (non illustrated). The values of capacitive elements C1 and C2 forming the capacitive divider of reference branch 400 are respectively selected to be 0.1 pF and 0.2 pF.

In accordance with the principle described with reference to FIG. 2, branches 201, 202 and 400 each include a bipolar transistor BP10, BP11, BP20, respectively. A current mirror type circuit arrangement formed of four MOS transistors M11, M12, M13 and M14 assures that a constant current i0 passes through the branches including bipolar transistors BP10, BP11 and BP20. Current i0 is of the order of 1 $\mu$A in this example.

The biasing of bipolar transistors BP10, BP11 and BP20 is assured by resistive elements R10, R11 and R20 connected respectively between the control electrodes (bases) of the bipolar transistors and a biasing potential Vpol. By way of illustration, resistive elements R10, R11 and R20 have values of the order of 100 k$\Omega$ in this example and the biasing potential Vpol is selected to be 0.2 V. The value of coupling capacitors C01 and C02 mounted respectively at the inputs of measuring branches 201 and 202 is, in this example, of the order of 0.3 pF at the frequency of 434 MHz of the oscillation signal. The value of decoupling capacitors Ca1 and Ca2 mounted respectively at the output of measuring branches 201 and 202 is of the order of 1 pF and decoupling capacitor Cb mounted at the output of reference branch 400 is of the order of 10 pF.

As illustrated in FIG. 3, measuring voltage Vout generated at the output of measuring branch 201 is thus applied on a non-inverting terminal of comparator 300 and reference voltage Vref generated at the output of reference branch 400 is applied to an inverting terminal of comparator 300, this comparator 300 generating in response the control signal Sc which is applied on control terminal 12 of oscillator circuit 1.

It will be noted that the numerical examples indicated hereinbefore are indicated solely by way of illustration. The sizing of the constituent components of the measuring and reference branches will of course have to be adapted to the desired application. In the case of an oscillator circuit such as that illustrated in FIG. 3, the sizing of the components thus depends in particular on the frequency of the oscillation signal supplied by the oscillator circuit and the switching frequency of the switch in the reference branch. Those skilled in the art will be perfectly capable of effecting such sizing according to the desired application.

In case the switching frequency of the voltage reference is derived directly from the frequency of the alternating output signal of the electronic device, it will be convenient to provide the device with additional means for ensuring an adequate start-up of the device. Indeed, when the electronic device is inactive, i.e. when no alternating signal is generated at the output of the device, the frequency for building the reference voltage is also zero. In this case, the measuring and reference signals Vout and Vref have substantially equal values and the control signal generated at the output of the comparator means maintain the electronic device in its current state, thereby preventing start-up of the device.

Figure 4:
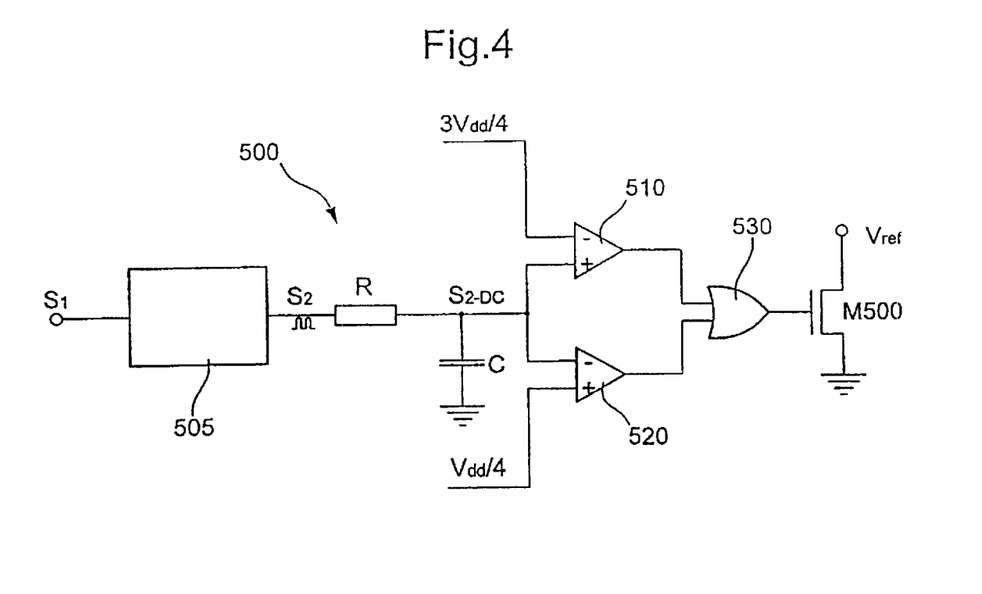
FIGS. 4 and 5 show two embodiments of oscillation detecting means for detecting the activity of the electronic device and, in case the electronic device is not generating any alternating output signal, for acting on the control signal so as to allow start-up of the electronic device.
Figure 5:
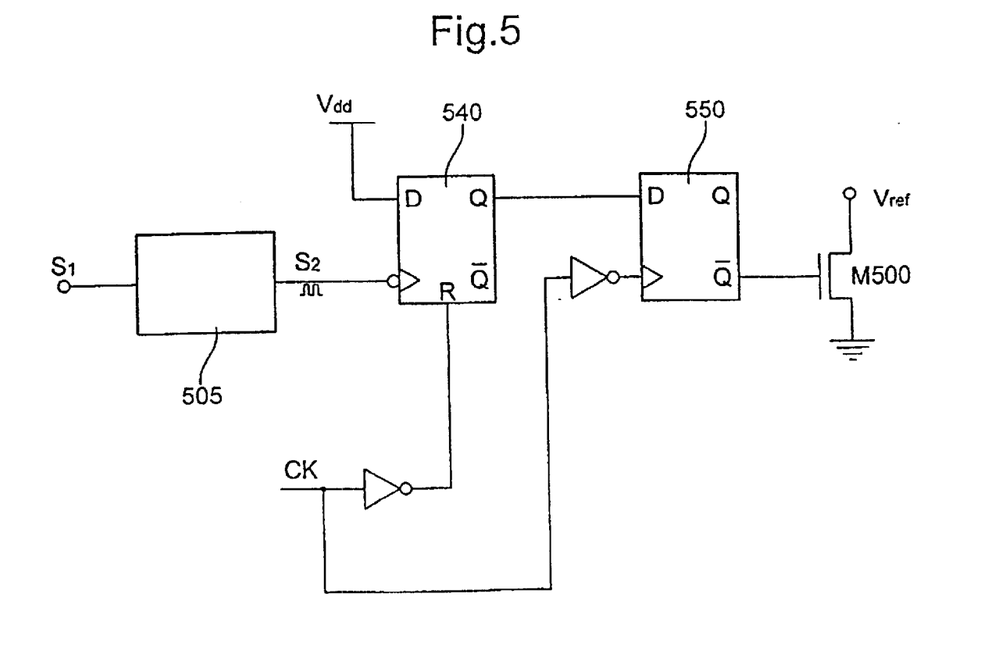

Referring to FIGS. 4 and 5, one will now describe two embodiments of oscillation detection means for detecting the electronic device's activity and for acting on the control signal so as to allow start-up of the electronic device in case the electronic device is not generating any alternating output signal. More specifically, these oscillation detection means include means for bringing the reference voltage generated by the reference branch to a determined value which is different from the measuring voltage (for example by pulling it to ground Vss) in case the electronic device is not generating any alternating output signal.

FIG. 4 thus shows a first embodiment, in analog form, of oscillation detection means designated globally by reference numeral 500. These means 500 receive at the input an alternating signal S2 substantially equal to or derived from the alternating output signal S1 of electronic device 1. Alternating signal S2 is preferably a relatively low frequency signal and can typically be derived from alternating output signal S1 after division (for example by means of a division stage 505 as schematically illustrated in the figure). One will admit in the following description of this embodiment that this alternating signal S2 oscillates between voltage levels Vss and Vdd. Means 500 are connected at the output to the terminal where reference voltage Vref is supplied, i.e. to the inverting input of comparator 30 in the illustrations of FIGS. 1 to 3.

More specifically, oscillation detection means 500 include at the input an arrangement of a resistive element R and of a capacitive element C for extracting the mean value, or DC component, designated S2-DC, of alternating signal S2. This mean value S2-DC is applied to the inputs of two comparators 510, 520 adapted for respectively comparing the mean value of alternating signal S2 with determined high and low thresholds, selected in this example to be equal to ¾ Vdd and ¼ Vdd. Two comparators are provided in the shown example because signal S2, which is supplied at the output of division stage 505, can take either a low value (substantially equal to Vss) or high value (substantially equal to Vdd) in the inactive state. The use of a single comparator might be envisaged provided that signal S2 takes only one determined value in the inactive state.

In the example of FIG. 4, each comparator 510, 520 generates at its output a signal indicating whether the mean value S2-DC of input signal S2 is greater than the high threshold, respectively whether this value is lower than the low threshold defined hereinabove. Both outputs of comparators 510, 520 are connected to an OR gate 530 the output of which controls the gate of a MOS transistor M500 connected by its current electrodes between reference voltage Vref and ground Vss in this example.

Accordingly, in case the electronic device is inactive (signal S2 to Vss or Vdd), transistor M500 is controlled to bring reference voltage Vref to ground. Referring to the embodiments of FIGS. 1 to 3, one will note that measuring voltage Vout generated at the output of the measuring branch is inversely proportional to the amplitude of alternating output signal S1 and is in particular maximal for a zero amplitude of output signal S1. By bringing reference voltage Vref to ground (that is a voltage different from the measuring voltage Vout) according to what has just been described above, start-up of the electronic device can thereby be achieved.

FIG. 5 shows a second embodiment of oscillation detection means 500 forming an alternative to the embodiment of FIG. 4. In contrast to the example of FIG. 4, this alternative is realised in digital form and comprises two D flip-flops, indicated by reference numerals 540 and 550. The first flip-flop 540 is clocked by the frequency of alternating signal S2 (such as a relatively low frequency signal derived from alternating output signal S1, as before) and its input D is fixed to a high logic level (Vdd). The non-inverting output of flip-flop 540 is connected to input D of the second flip-flop 550. The inverting output of this second flip-flop 550 is connected to the gate of transistor M500. A clock signal CK having a frequency lower than the frequency of input signal S2 is used for resetting the first flip-flop and for clocking the second flip-flop 550. This clock signal CK is not derived from the alternating output signal S1 of the electronic device be is derived from another source.

In the example of FIG. 5, in case the electronic device is inactive, the first flip-flop 540 is not anymore clocked by a clock signal and its output takes a low logic level, provoking, following a clock pulse of signal CK, the passage to a high logic level of the inverting output of flip-flop 550 controlling transistor M500. Reference voltage Vref is thus again pulled to ground Vss so as to allow start-up of the electronic device.

It will be understood that various modifications and/or improvements obvious to those skilled in the art may be made to the amplitude controlled electronic device described in the present invention without departing from the scope of the invention defined by the annexed claims.

What is claimed is:

1. An amplitude-controlled electronic device for generating at an output an alternating output signal of substantially constant amplitude, said electronic device including:
   a measuring branch for generating a measuring voltage representative of the amplitude of said output signal;
   a reference branch for generating a reference voltage, this reference branch being matched with said measuring branch so that the reference voltage has a sensitivity to temperature and manufacturing process variations which is substantially equal to the sensitivity of said measuring voltage; and a comparator for comparing said measuring voltage with said reference voltage and generating in response a control signal which is applied on a control terminal of said electronic device in order to control the amplitude of said output signal;

wherein a voltage reference is switched at a selected switching frequency at an input of said reference branch in order to generate said reference voltage.

2. An electronic device according to claim 1, wherein the switching frequency of said voltage reference is derived from the frequency of said alternating output signal.

3. An electronic device according to claim 1, wherein said measuring branch includes:
   a first MOS transistor including a control electrode and first and second current electrodes;
   a first capacitive element mounted in series between the output of the electronic device and the control electrode of the first transistor;
   a first current source mounted in series with said first transistor and generating a substantially constant current;
   a first resistive element mounted between the first current electrode and the control electrode of said first transistor; and
   a second capacitive element mounted in parallel with said first transistor between its first and second current electrodes;
   said measuring voltage being generated at said first current electrode of the first transistor;
   and wherein said reference branch includes:
      a second MOS transistor matched with said first transistor and including a control electrode and first and second current electrodes;
      a capacitive divider including third and fourth capacitive elements mounted in series between an input terminal and a reference potential, and switching means for selectively applying said voltage reference and said reference potential to said input terminal of the capacitive divider, an intermediate terminal of said capacitive divider being connected to the control electrode of said second transistor;
      a second current source mounted in series with said second transistor and also generating said substantially constant current;
      a second resistive element of substantially equal value to said first resistive element mounted between the first current electrode and the control electrode of said second transistor; and
      a fifth capacitive element mounted in parallel with said second transistor between its first and second current electrodes;
      said reference voltage being generated at said first current electrode of the second transistor.

4. An electronic device according to claim 1, wherein said measuring branch includes:
   a first bipolar transistor including a control electrode and first and second current electrodes;
   a first capacitive element mounted in series between the output of the electronic device and the control electrode of the first transistor;
   a first current source mounted in series with said first transistor and generating a substantially constant current;
   a first resistive element mounted between the first control electrode of said first transistor and a biasing potential; and
   a second capacitive element mounted in parallel with said first transistor between its first and second current electrodes;
   said measuring voltage being generated at said first current electrode of the first transistor;
   and wherein said reference branch includes:
      a second bipolar transistor matched with said first transistor and including a control electrode and first and second current electrodes;
      a capacitive divider including third and fourth capacitive elements mounted in series between an input terminal and a reference potential, and switching means for selectively applying said voltage reference and said reference potential to said input terminal of the capacitive divider, an intermediate terminal of said capacitive divider being connected to the control electrode of said second transistor;
      a second current source mounted in series with said second transistor and also generating said substantially constant current;
      a second resistive element of substantially equal value to said first resistive element mounted between the control electrode of said second transistor and said biasing potential; and
      a fifth capacitive element mounted in parallel with said second transistor between its first and second current electrodes;
      said reference voltage being generated at said first current electrode of the second transistor.

5. An electronic device according to claim 4, wherein said bipolar transistors are uncharacterised vertical bipolar transistors.

6. An electronic device according to claim 4, wherein the switching frequency of said voltage reference is derived from the frequency of said alternating output signal.

7. An electronic device according to claim 4, wherein the sum of the capacitance values of said third and fourth capacitive elements is substantially equal to the capacitance value of said first capacitive element.

8. An electronic device according to claim 1, wherein the electronic device is an oscillator circuit including first and second outputs generating respectively a first oscillation signal which is applied on said measuring branch and a second oscillation signal, phase shifted by 180° with respect to the first oscillation signal, which is applied on a second branch matched with said measuring branch in order to load said first and second outputs of the oscillator circuit symmetrically.

9. An electronic device according to claim 2, further comprising oscillation detecting means for detecting the activity of said electronic device and, in case said electronic device is not generating any alternating output signal, for acting on said control signal so as to allow start-up of said electronic device.

10. An electronic device according to claim 9, wherein said oscillation detection means include means for bringing said reference voltage to a determined value which is different from the value of said measuring voltage in case said electronic device is not generating any alternating output signal.

11. An electronic device according to claim 3, wherein the switching frequency of said voltage reference is derived from the frequency of said alternating output signal.

12. An electronic device according to claim 3, wherein the sum of the capacitance values of said third and fourth capacitive elements is substantially equal to the capacitance value of said first capacitive element.

13. An amplitude-controlled electronic device for generating at an output an alternating output signal of substantially constant amplitude, said electronic device including:
- a measuring branch for generating a measuring voltage representative of the amplitude of said output signal;
- a reference branch for generating a reference voltage; and
- a comparator for comparing said measuring voltage with said reference voltage and generating in response a control signal which is applied on a control terminal of said electronic device in order to control the amplitude of said output signal, said measuring branch including:
- a first transistor including a control electrode and first and second current electrodes;
- a first capacitive element mounted in series between the output of the electronic device and the control electrode of the first transistor;
- a first current source mounted in series with said first transistor and generating a substantially constant current;
- a first resistive element connected to the control electrode of said first transistor; and
- a second capacitive element mounted in parallel with said first transistor between its first and second current electrodes,
- said measuring voltage being generated at said first current electrode of the first transistor;

said reference branch being matched with said measuring branch so that the reference voltage has a sensitivity to temperature and manufacturing process variations which is substantially equal to the sensitivity of said measuring voltage, said reference branch including:
- a second transistor matched with said first transistor and including a control electrode and first and second current electrodes;
- a capacitive divider including third and fourth capacitive elements mounted in series between an input terminal and a reference potential, an intermediate terminal of said capacitive divider being connected to the control electrode of said second transistor;
- switching means for selectively applying a voltage reference or said reference potential to said input terminal of the capacitive divider;
- a second current source mounted in series with said second transistor and also generating said substantially constant current;
- a second resistive element of substantially equal value to said first resistive element connected to the control electrode of said second transistor; and
- a fifth capacitive element mounted in parallel with said second transistor between its first and second current electrodes,
- said reference voltage being generated at said first current electrode of the second transistor.

14. An electronic device according to claim 13, wherein said first and second transistors are MOS transistors and wherein said first and second resistive elements are connected between the first current electrode and the control electrode of, respectively, the first and second transistors.

15. An electronic device according to claim 13, wherein said first and second transistors are bipolar transistors and wherein said first and second resistive elements are connected between a biasing potential and the control electrode of, respectively, the first and second transistors.

16. An electronic device according to claim 15, wherein said bipolar transistors are uncharacterised vertical bipolar transistors.

17. An electronic device according to claim 13, wherein the switching frequency of said voltage reference is derived from the frequency of said alternating output signal.

18. An electronic device according to claim 13, wherein the sum of the capacitance values of said third and fourth capacitive elements is substantially equal to the capacitance value of said first capacitive element.

* * * * *